US009958480B2

(12) United States Patent
Nejatali et al.

(10) Patent No.: US 9,958,480 B2
(45) Date of Patent: May 1, 2018

(54) APPARATUS AND METHOD FOR A CURRENT SENSOR

(71) Applicant: QUALCOMM Incorporated, San Diego, CA (US)

(72) Inventors: Saeed Nejatali, San Diego, CA (US); Francesco Carobolante, Carlsbad, CA (US); Linda Stacey Irish, San Diego, CA (US); Cody Wheeland, San Diego, CA (US); Greg Bachmanek, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 14/618,343

(22) Filed: Feb. 10, 2015

(65) Prior Publication Data

US 2016/0231364 A1 Aug. 11, 2016

(51) Int. Cl.
*G01R 19/00* (2006.01)
*G01R 15/20* (2006.01)
(Continued)

(52) U.S. Cl.
CPC .......... *G01R 15/20* (2013.01); *G01R 15/181* (2013.01); *G01R 19/0092* (2013.01);
(Continued)

(58) Field of Classification Search
CPC .............. G01R 19/0092; G01R 15/181; G01R 33/0076; G01R 15/20; H02J 5/005;
(Continued)

(56) References Cited

U.S. PATENT DOCUMENTS 4,887,029 A 12/1989 Hemminger
5,343,143 A 8/1994 Voisine et al.
(Continued)

FOREIGN PATENT DOCUMENTS

DE 102013106100 A1 12/2014
EP 1855118 A1 11/2007
(Continued)

OTHER PUBLICATIONS

International Search Report and Written Opinion from International Application No. PCT/US2016/048332 (152633WO—related application), dated Jan. 2, 2017, ISA/EPO, 15 pgs.
(Continued)

*Primary Examiner* — Patrick Assouad
*Assistant Examiner* — Haidong Zhang
(74) *Attorney, Agent, or Firm* — Hunter Clark PLLC

(57) ABSTRACT

Disclosed is a current sensor that senses current flow in a conductor by coupling a first magnetic field generated by the conductor to a sense element. The current sensor includes a shield including a first material that sandwiches the sense element to define a stack and a second material that sandwiches the stack. The shield is configured to generate a second magnetic field, responsive to a third magnetic field external to the current sensor that opposes the third magnetic field. The shield is further configured to prevent production of a magnetic field that opposes the first magnetic field generated by the flow of current in the conductor.

20 Claims, 12 Drawing Sheets

(51) Int. Cl.
  *G01R 15/18* (2006.01)
  *H02J 7/02* (2016.01)
  *H02J 7/04* (2006.01)
  *H02J 50/12* (2016.01)
  *G01R 33/00* (2006.01)
  *H04B 5/00* (2006.01)
(52) U.S. Cl.
  CPC .............. *H02J 7/025* (2013.01); *H02J 7/04* (2013.01); *H02J 50/12* (2016.02); *G01R 33/0076* (2013.01); *H04B 5/0037* (2013.01)
(58) Field of Classification Search
  CPC ... H02J 50/12; H02J 7/025; H02J 7/04; H04B 5/0037
  See application file for complete search history.

(56) References Cited

U.S. PATENT DOCUMENTS

| | | | |
|---|---|---|---|
| 6,348,800 | B1 | 2/2002 | Haensgen et al. |
| 6,624,624 | B1 | 9/2003 | Karrer et al. |
| 7,885,774 | B2 | 2/2011 | Swank |
| 7,898,240 | B2 | 3/2011 | Shibahara et al. |
| 8,373,385 | B2 | 2/2013 | Takagi |
| 8,415,948 | B2 | 4/2013 | Ueno et al. |
| 8,878,520 | B2 | 11/2014 | Tamura |
| 2003/0020583 | A1* | 1/2003 | Hui .................. H01F 27/365 336/200 |
| 2007/0194797 | A1 | 8/2007 | Ibuki et al. |
| 2009/0312970 | A1* | 12/2009 | Kalenine ............... G01R 15/09 702/64 |
| 2011/0172552 | A1 | 7/2011 | Rothman et al. |
| 2012/0161533 | A1 | 6/2012 | Urano |
| 2013/0008022 | A1 | 1/2013 | Yao et al. |
| 2013/0043967 | A1 | 2/2013 | Rouaud et al. |
| 2013/0127448 | A1 | 5/2013 | Hyacinthe et al. |
| 2014/0015516 | A1 | 1/2014 | Sorensen et al. |
| 2014/0049250 | A1 | 2/2014 | Brown et al. |
| 2014/0062213 | A1 | 3/2014 | Wheatley, III et al. |
| 2014/0111154 | A1 | 4/2014 | Roy et al. |
| 2015/0061645 | A1 | 3/2015 | Nemoto et al. |
| 2015/0115945 | A1* | 4/2015 | Bureau .............. G01N 27/9033 324/242 |
| 2017/0074908 | A1 | 3/2017 | Nejatali et al. |

FOREIGN PATENT DOCUMENTS

| | | |
|---|---|---|
| EP | 2136216 A1 | 12/2009 |
| EP | 2355265 A2 | 8/2011 |
| EP | 2724167 A1 | 4/2014 |
| EP | 2742888 A1 | 6/2014 |
| JP | 2001264364 A | 9/2001 |
| JP | 2009085620 A | 4/2009 |
| JP | 2014224695 A | 12/2014 |
| WO | 2014118895 A1 | 8/2014 |
| WO | 2015058733 A1 | 4/2015 |

OTHER PUBLICATIONS

Second Written Opinion from International Application No. PCT/US2016/013231, dated Jan. 16, 2017, ISA/EPO, 7 pgs.
International Search Report and Written Opinion—PCT/US2016/013231—ISA/EPO—dated Apr. 22, 2016—14 pgs.
International Preliminary Report on Patentability—PCT/US2016/013231, The International Bureau of WIPO—Geneva, Switzerland, May 31, 2017.

* cited by examiner

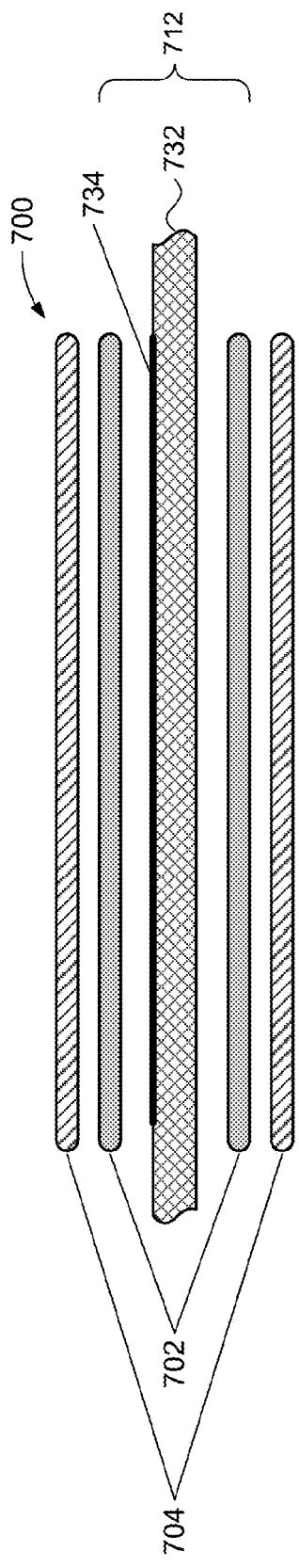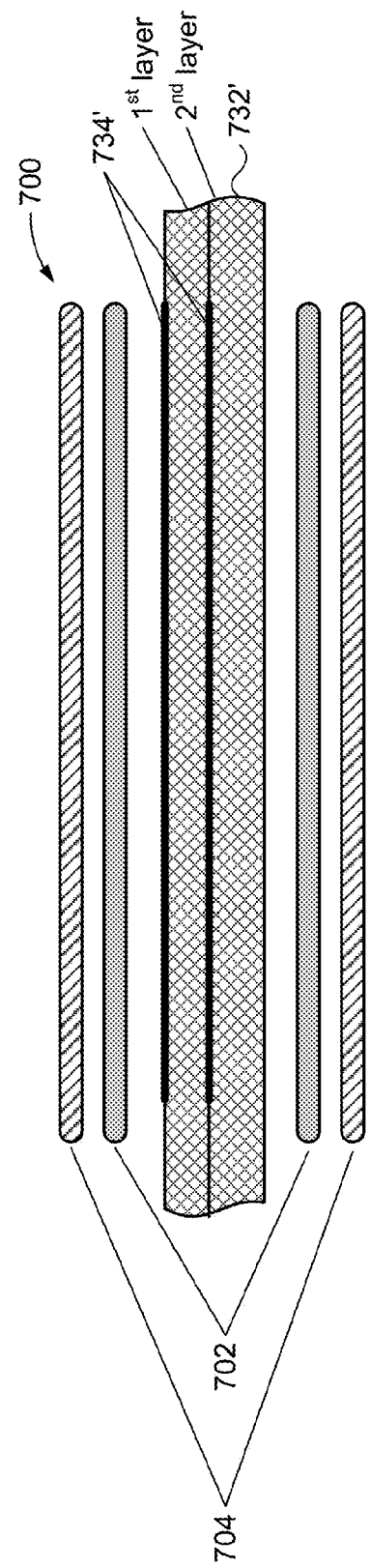
Fig. 7A
Fig. 7B

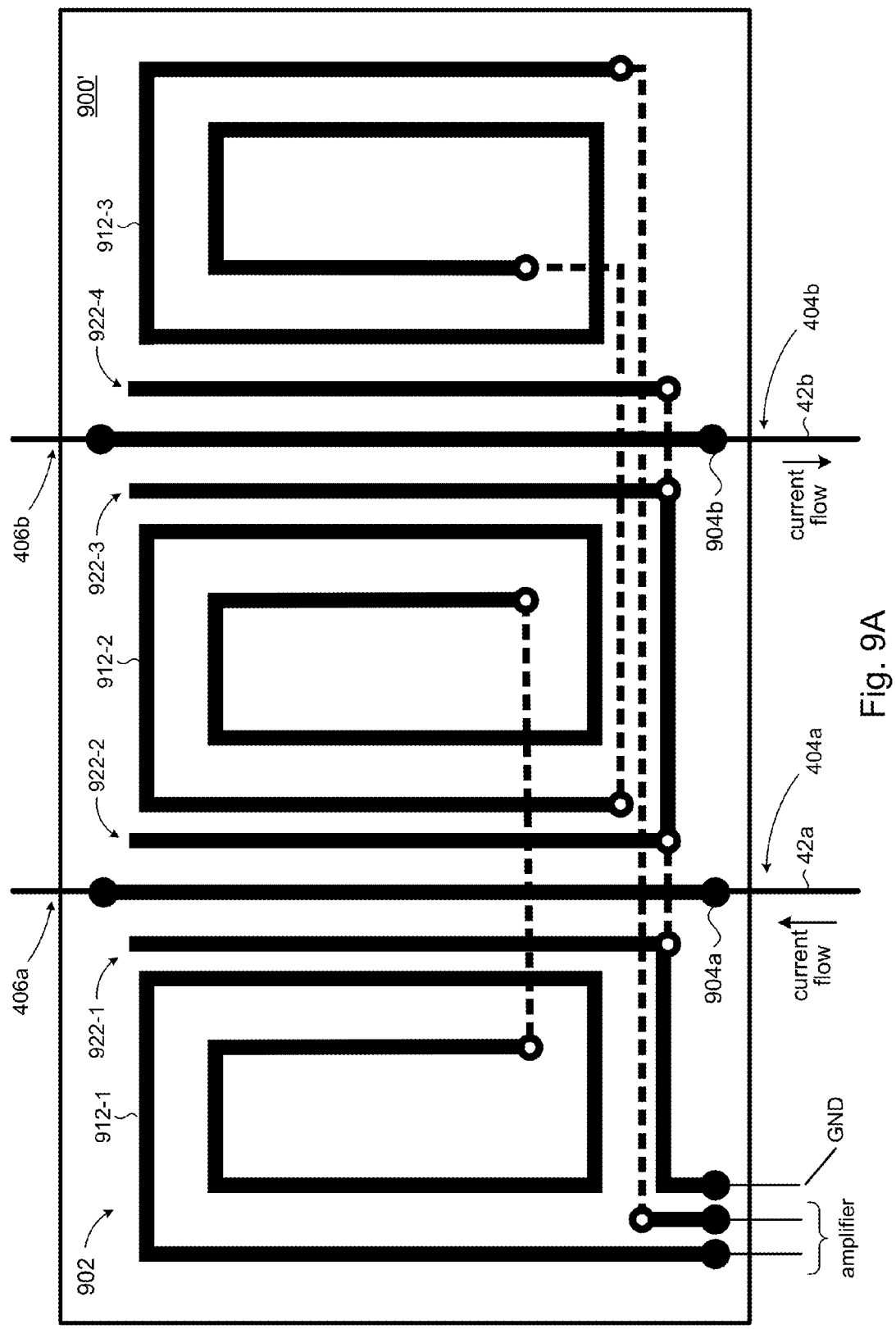

APPARATUS AND METHOD FOR A CURRENT SENSOR

TECHNICAL FIELD

The present disclosure generally relates to current sensors. More specifically, the disclosure is directed to devices, systems, and methods related to current sensors using magnetic induction.

BACKGROUND

Accurate current measurement can be important in electronic systems. For example, in a wireless power transfer system, accurate measurement of the current injected into the antenna coil of a power transmit unit (PTU) may be used to maintain proper levels of electromagnetic (EM) radiation into the environment. Some solutions may be based on measuring the voltage drop across two series capacitors, one capacitor attached to each of the coil leads of the antenna. Measuring the voltage directly can create technical challenges related to the design of the differential voltage buffer and amplifier circuits because both coil leads are at a high voltage. In addition, the measurement process can be complex, requiring the measurement of the voltage across the antenna coil behind the series capacitors and then measuring the voltage after the series capacitors, along with fast switching of voltages that feed into low pass filters. The approach has some disadvantages: the circuitry may require costly components to implement; and the process of taking measurements can create a good amount of electromagnetic interference (EMI) due to switching noise which can be injected into the antenna.

SUMMARY

The present disclosure describes a current sensor operative to sense a flow of current in a conductor. In various embodiments, the current sensor includes a sense element configured to couple to a first magnetic field generated by the flow of current in the conductor and to produce a signal that is representative of the flow of current in the conductor. The current sensor further includes a shield comprising a first material that sandwiches the sense element to define a stack, and a second material that sandwiches the stack. The shield is configured to generate a second magnetic field, responsive to a third magnetic field external to the current sensor, that opposes the third magnetic field. The shield is further configured to prevent production of a magnetic field that opposes the first magnetic field generated by the flow of current in the conductor.

In some embodiments, the shield is further configured to close a path for the first magnetic field.

In some embodiments, the first material may be a ferrite material and the second material may be an electrically conductive material.

In some embodiments, the current sensor may include a capacitive shield disposed adjacent the sense element to avoid capacitive coupling of an electric field between the conductor and the sense element. In some embodiments, the capacitive shield may be a conductive lead having a free first end and a second end configured for a connection to ground potential, thereby providing a path to ground for the electric field.

In some embodiments, the sense element may include a coil disposed on a substrate. In some embodiments, the substrate may be a layer of a multi-layer printed circuit board (PCB).

In some embodiments, the sense element may include a first coil disposed on a first plane and at least a second coil disposed on at least a second plane spaced apart from the first plane. In some embodiments, a first capacitive shield may be disposed adjacent the first coil and the conductor, and a second capacitive shield may be disposed adjacent the second coil and the conductor. In some embodiments, the first coil may be connected in series with the second coil. In some embodiments, the first coil may be a trace formed on a layer of a multi-layer PCB and the second coil may be a trace formed on another layer of the multi-layer PCB.

In some embodiments, the sense element may be a first coil arranged to be adjacent the conductor; and a second electrically conductive coil disposed in opposed relation to the first electrically conductive coil and arranged to be adjacent the conductor. In some embodiments, the first coil and the second coil may be substantially coplanar.

In some embodiments, the current sensor may include an amplifier circuit connected to the sense element to generate an output voltage based on the signal produced by the sense element.

In some embodiments, the conductor constitutes a portion of or is configured to drive a transmit coil configured to generate an external magnetic field for wireless power transfer, wherein the external magnetic field constitutes the third magnetic field.

The present disclosure describes a method for sensing current. In some embodiments, the method includes generating an output voltage representative of the current flowing in the conductor by magnetically coupling, at a sensing area, to a first magnetic field generated by the current flowing in the conductor. The method further includes shielding the sensing area from an external magnetic field including generating a second magnetic field that opposes the external magnetic field so that the output voltage generated by magnetically coupling to the first magnetic field is substantially free of influence from the external magnetic field. The method further includes preventing production of a magnetic field that opposes the first magnetic field generated by the flow of current in the conductor.

In some embodiments, preventing production of the magnetic field that opposes the first magnetic field includes coupling the first magnetic field to a ferrite material that at least partially encloses the sensing area.

In some embodiments, the method may further include shielding the sensing area from an electric field generated by the current flowing in the conductor so that the generated output voltage is substantially free of influence from the electric field.

In some embodiments, magnetically coupling to the first magnetic field may include disposing a coil of electrically conductive material adjacent the conductor. In some embodiments, the method may include shielding the sensing area from an electric field generated by the current flowing in the conductor by disposing a conductive lead adjacent the conductor and the coil of electrically conductive material and connecting the conductive lead to ground potential.

In some embodiments, magnetically coupling to the first magnetic field may include disposing a first coil adjacent the conductor and a second coil adjacent the conductor. In some embodiments, the first coil may be coplanar with the second coil. In some embodiments, the first coil may be on a plane separate from the second coil.

The present disclosure describes a current sensor having first means for magnetically coupling, at a sensing area proximate a conductor, to a first magnetic field generated by a current flow in the conductor. In some embodiments, the current sensor may include a second means for generating a second magnetic field that opposes an external magnetic field to shield the sensing area from the external magnetic field so that the output of the first means is substantially free of influence from the external magnetic field. In some embodiments, the current sensor may include third means for shielding the sensing area from the second means so that the output of the first means is substantially free of influence from effects of the second means.

In some embodiments, the second means may include an electrically conductive material that at least partially encloses the sensing area. In some embodiments, the third means may include a ferrite material that at least partially encloses the sensing area and is disposed within the electrically conductive material.

In some embodiments, the current sensor may include a fourth means for shielding an electric field generated by the current flow in the conductor so that the output of the first means is substantially free of influence from the electric field. In some embodiments, the fourth means may include a conductive lead configured to be disposed adjacent the first means and the conductor.

In some embodiments, the first means may be a loop of electrically conductive material disposed on a substrate. In some embodiments, the loop may have a plurality of turns.

In some embodiments, the present disclosure describes an apparatus for wirelessly transmitting charging power to a receiver device. The apparatus includes a transmit coil configured to generate a first magnetic field for wirelessly transmitting charging power to the receiver device in response to being driven by an alternating current. The apparatus further includes a driver circuit electrically coupled to the transmit coil via a conductor, the driver circuit configured to drive the transmit coil with the alternating current via the conductor. The apparatus further includes a current sensor configured to sense a flow of current in the conductor. The current sensor includes a sense coil configured to couple to a second magnetic field generated by the alternating current in the conductor to produce a signal that is indicative of the flow of current in the conductor. The current sensor further includes a shield comprising a ferromagnetic material that sandwiches the sense coil to define a stack and comprising an electrically conducting material that sandwiches the stack.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. In the accompanying drawings:

FIGS. 7A and 7B illustrate side views of a magnetic shield in accordance with the present disclosure.

FIG. 9A shows an illustrative embodiment of a current sensor in accordance with aspects of the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
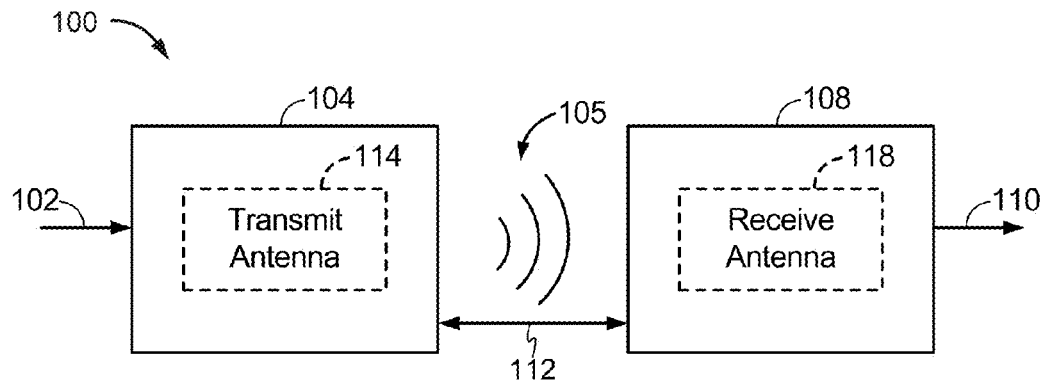
FIG. 1 is a functional block diagram of a wireless power transfer system, in accordance with an illustrative embodiment.

FIG. 1 is a functional block diagram of a wireless power transfer system 100, in accordance with an illustrative embodiment. An input power 102 may be provided to a transmitter 104 from a power source (not shown in this figure) to generate a wireless (e.g., magnetic or electromagnetic) field 105 for performing energy transfer. A receiver 108 may couple to the wireless field 105 and generate an output power 110 for storing or consumption by a device (not shown in this figure) coupled to the output power 110. The transmitter 104 and the receiver 108 may be separated by a distance 112.

In one illustrative embodiment, the transmitter 104 and the receiver 108 may be configured according to a mutual resonant relationship. When the resonant frequency of the receiver 108 and the resonant frequency of the transmitter 104 are substantially the same or very close, transmission losses between the transmitter 104 and the receiver 108 are minimal. As such, wireless power transfer may be provided over a larger distances. Resonant inductive coupling techniques may thus allow for improved efficiency and power transfer over various distances and with a variety of inductive coil configurations.

The receiver 108 may receive power when the receiver is located in the wireless field 105 produced by the transmitter 104. The wireless field 105 corresponds to a region where energy output by the transmitter 104 may be captured by the receiver 108. The wireless field 105 may correspond to the "near field" of the transmitter 104 as will be further described below. The transmitter 104 may include a transmit antenna or coil 114 for transmitting energy to the receiver 108. The receiver 108 may include a receive antenna or coil 118 for receiving or capturing energy transmitted from the transmitter 104. The near-field may correspond to a region in which there are strong reactive fields resulting from the currents and charges in the transmit coil 114 that minimally radiate power away from the transmit coil 114. The near-field may correspond to a region that is within about one wavelength (or a fraction thereof) of the transmit coil 114.

As described above, efficient energy transfer may occur by coupling a large portion of the energy in the wireless field 105 to the receive coil 118 rather than propagating most of the energy in an electromagnetic wave to the far field. When positioned within the wireless field 105, a "coupling mode" may develop between the transmit coil 114 and the receive coil 118.

In FIG. 1, the transmitter 104 may output a time varying magnetic (or electromagnetic) field with a frequency corresponding to the resonant frequency of the transmit coil 114. When the receiver 108 is within the wireless field 105, the time varying magnetic (or electromagnetic) field may induce a current in the receive coil 118. As described above, if the receive coil 118 is configured to resonate at the frequency of the transmit coil 114, energy may be efficiently transferred. The AC signal induced in the receive coil 118 may be rectified as described above to produce a DC signal that may be provided to charge or to power a load.

Figure 2:
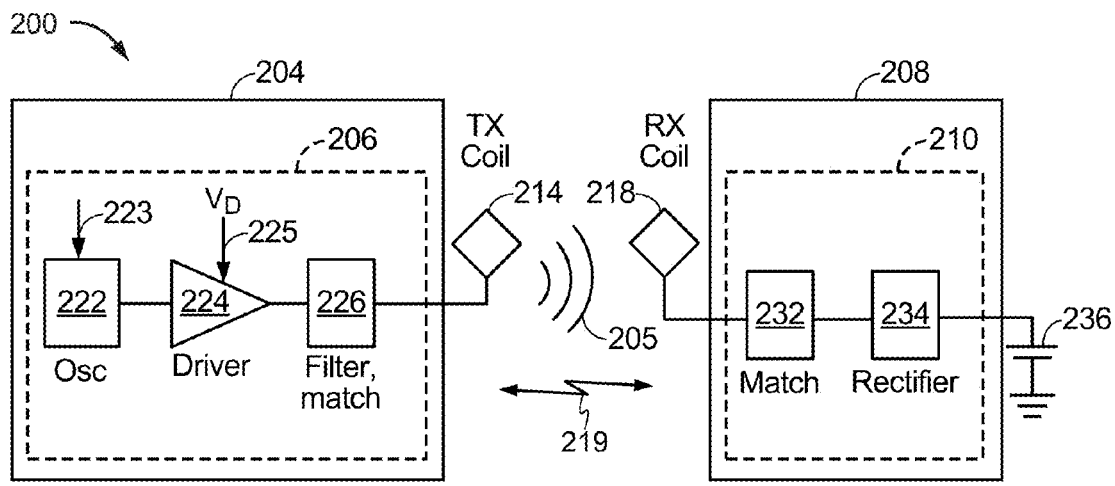
FIG. 2 is a functional block diagram of a wireless power transfer system, in accordance with an illustrative embodiment.

FIG. 2 is a functional block diagram of a wireless power transfer system 200, in accordance with another illustrative embodiment. The system 200 may include a transmitter 204 and a receiver 208. The transmitter 204 (also referred to herein as power transfer unit, PTU) may include transmit circuitry 206 that may include an oscillator 222, a driver circuit 224, and a filter and matching circuit 226. The oscillator 222 may be configured to generate a signal at a desired frequency that may adjust in response to a frequency control signal 223. The oscillator 222 may provide the oscillator signal to the driver circuit 224. The driver circuit 224 may be configured to drive the transmit antenna 214 at, for example, a resonant frequency of the transmit antenna 214 based on an input voltage signal (VD) 225. The driver circuit 224 may be a switching amplifier configured to receive a square wave from the oscillator 222 and output a sine wave.

The filter and matching circuit 226 may filter out harmonics or other unwanted frequencies and match the impedance of the transmitter 204 to the transmit antenna 214. As a result of driving the transmit antenna 214, the transmit antenna 214 may generate a wireless field 205 to wirelessly output power at a level sufficient for charging a battery 236, or otherwise powering a load.

The receiver 208 (also referred to herein as power receiving unit, PRU) may include receive circuitry 210 that may include a matching circuit 232 and a rectifier circuit 234. The matching circuit 232 may match the impedance of the receive circuitry 210 to the receive antenna 218. The rectifier circuit 234 may generate a direct current (DC) power output from an alternating current (AC) power input to charge the battery 236, as shown in FIG. 2. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205.

The receiver 208 may be configured to determine whether an amount of power transmitted by the transmitter 204 and received by the receiver 208 is appropriate for charging the battery 236. Transmitter 204 may be configured to generate a predominantly non-radiative field with a direct field coupling coefficient (k) for providing energy transfer. Receiver 208 may directly couple to the wireless field 205 and may generate an output power for storing or consumption by a battery (or load) 236 coupled to the output or receive circuitry 210.

As discussed above, transmitter 204 and receiver 208 may be separated by a distance and may be configured according to a mutual resonant relationship to minimize transmission losses between the transmitter and the receiver.

Figure 3:
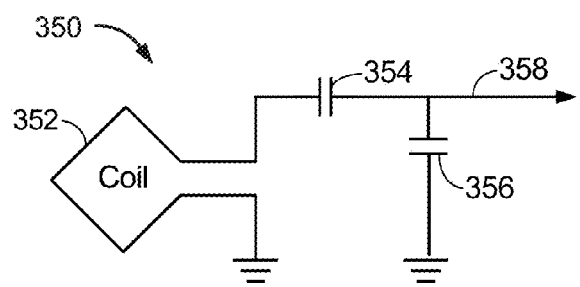
FIG. 3 is a schematic diagram of a portion of transmit circuitry or receive circuitry of FIG. 2 including a transmit or receive antenna, in accordance with an illustrative embodiment.

FIG. 3 is a schematic diagram of a portion of the transmit circuitry 206 or the receive circuitry 210 of FIG. 2, in accordance with illustrative embodiments. As illustrated in FIG. 3, transmit or receive circuitry 350 may include an antenna 352. The antenna 352 may also be referred to or be configured as a "loop" antenna 352. The antenna 352 may also be referred to herein or be configured as a "magnetic" antenna, or an induction coil, or a resonator. The term "antenna" generally refers to a component that may wirelessly output or receive energy for coupling to another "antenna." The antenna may also be referred to as a coil of a type that is configured to wirelessly output or receive power. As used herein, the antenna 352 is an example of a "power transfer component" of a type that is configured to wirelessly output and/or receive power. The antenna 352 may include an air core or a physical core such as a ferrite core (not shown in this figure).

As stated, efficient transfer of energy between the transmitter 104 (transmitter 204 as referenced in FIG. 2) and the receiver 108 (receiver 208 as referenced in FIG. 2) may occur during matched or nearly matched resonance between the transmitter 104 and the receiver 108. However, even when resonance between the transmitter 104 and receiver 108 are not matched, energy may be transferred, although the efficiency may be affected. For example, the efficiency may be less when resonance is not matched.

Transfer of energy occurs by coupling energy from the wireless field 105 (wireless field 205 as referenced in FIG. 2) of the transmit coil 114 (transmit coil 214 as referenced in FIG. 2) to the receive coil 118 (receive coil 218 as referenced in FIG. 2), residing in the vicinity of the wireless field 105, rather than propagating the energy from the transmit coil 114 into free space.

The resonant frequency of the loop or magnetic antennas is based on the inductance and capacitance. Inductance may be simply the inductance created by the antenna 352, whereas, capacitance (e.g., a capacitor) may be added to create a resonant structure at a desired resonant frequency. As a non limiting example, a capacitor 354 and a capacitor 356 may be added to the transmit or receive circuitry 350 to create a resonant circuit. Accordingly, for larger diameter antennas, the size of capacitance needed to sustain resonance may decrease as the diameter or inductance of the loop increases.

Furthermore, as the diameter of the antenna increases, the efficient energy transfer area of the near field may increase. Other resonant circuits formed using other components are also possible. As another non limiting example, a capacitor (not shown) may be placed in parallel between the two terminals of the circuitry 350. For transmit antennas, the signal 358, with a frequency that substantially corresponds to the resonant frequency of the antenna 352, may be an input to the antenna 352. For receive antennas, the signal 358, with a frequency that substantially corresponds to the resonant frequency of the antenna 352, may be an output from the antenna 352.

Figure 4A:
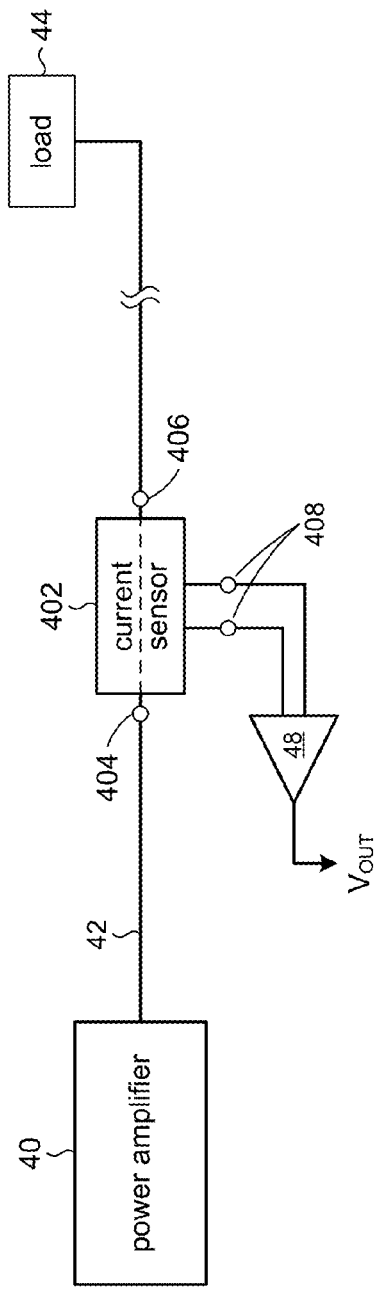
FIGS. 4A and 4B represent illustrative configurations that embody a current sensor in accordance with the present disclosure.

The discussion will now turn to a description of current sensors in accordance with the present disclosure, which may be used in the transmitter 104 of FIG. 1 or transmitter 204 of FIG. 2. FIG. 4A shows circuitry comprising a power amplifier 40 connected to a load 44 via a current-carrying conductor 42. A current sensor 402 in accordance with the present disclosure may be configured to sense the flow of current in the current-carrying conductor 42 and produce a signal that is representative of the flow of current in the conductor. Merely as an example to illustrate a usage case, the current sensor 402 may be incorporated in the wireless power transfer system 200 shown in FIG. 2. In this example, the power amplifier 40 may correspond to the driver circuit 224 in transmitter 204, and the load 44 may correspond to the transmit coil 214. The current sensor 402 may detect load changes in the transmit coil 214 during wireless power transfer as a consequence of variations in the amount of power that is being coupled to the receiver (e.g., PRU) via the magnetic field. For example, variations in power coupling may arise from the amount of power a PRU draws, the number of PRUs engaged in wireless power transfer with the PTU, and so on. The current-carrying conductor 42 may correspond to a connection (e.g., a wire) that provides current from the driver circuit 224 to the transmit coil 214. It will be appreciated, of course, that current sensors in accordance with the present disclosure may be readily adapted for use in other circuit configurations.

The current sensor 402 may include connections 404 and 406 to provide points of connection for the current-carrying conductor 42. The current sensor 402 may include outputs 408 that output a signal in response to the flow of current in conductor 42.

The outputs 408 may be connected to a suitable amplifier 48, for example, to produce a signal that represents the flow of current in the current-carrying conductor 42. In some embodiments, the output of amplifier 48 may be a current signal that represents the flow of current in the current-carrying conductor 42. In other embodiments, such as shown in FIG. 4A, the output of amplifier 48 may be an output voltage $V_{out}$ that represents the flow of current in the current-carrying conductor 42. In some embodiments, the output of amplifier 48 may be used as a feedback signal to control the flow of current out of the power amplifier 40. In other embodiments, the output of amplifier 48 may be used to monitor the operating conditions of the system. For example, in the context of the wireless power transfer system 200 shown in FIG. 2, in some embodiments, the current sensor 402 may be used to detect an overload condition. In other embodiments, the current sensor 402 may be used to detect placement of a PRU on the charging surface of the PTU, and so on.

Figure 4B:
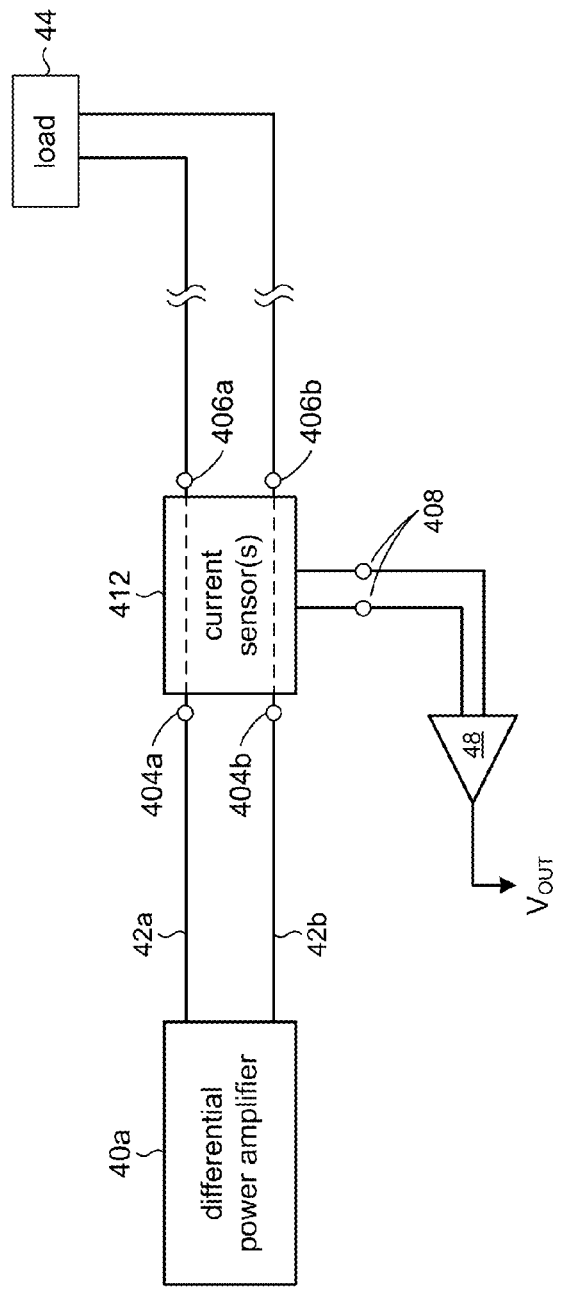

The power amplifier 40 in FIG. 4A represents an example of a single-ended output. Referring to FIG. 4B, a power amplifier 40a may have a differential output, providing power on two current-carrying conductors 42a and 42b. Accordingly, a current sensor 412 in accordance with some embodiments of the present disclosure may be configured to provide current sensing on multiple current-carrying conductors (e.g., 42a, 42b). In some embodiments, for example, the current sensor 412 may include connections 404a, 404b and 406a, 406b to provide points of connection for the current-carrying conductors 42a, 42b.

Figure 5:
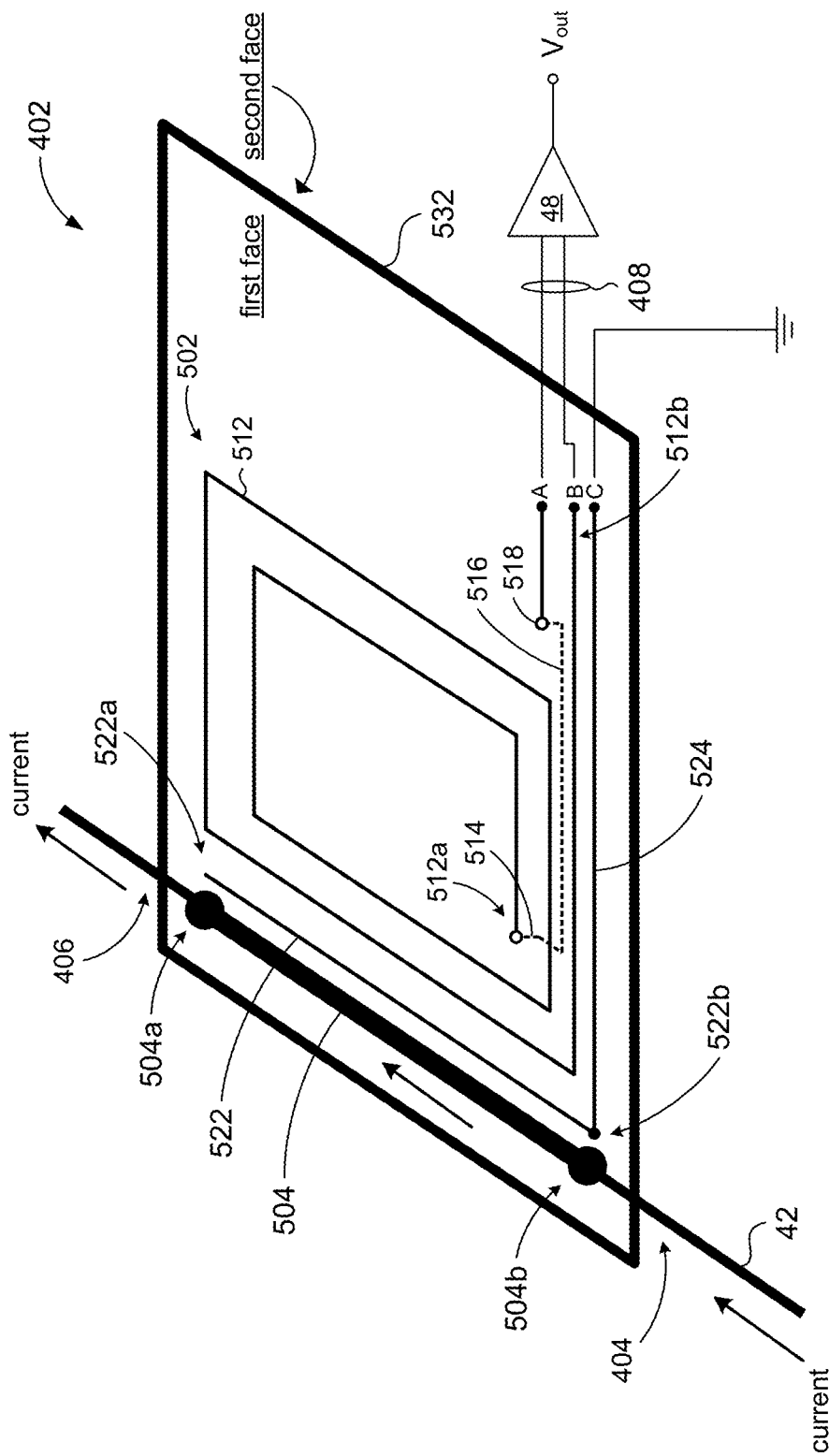
FIG. 5 shows an illustrative embodiment of a current sensor in accordance with aspects of the present disclosure.

The discussion will now turn to a description of an illustrative embodiment of current sensor 402 shown in FIG. 4A. FIG. 5 shows details of current sensor 402 in accordance with the present disclosure, along with some circuit elements shown in FIG. 4A included for context. In some embodiments, for example, current sensor 402 may comprise a sensing element 502 and a main (target) conductor 504 disposed on a plane, for example, as defined by a substrate 532. The sensing element 502 may be disposed adjacent the main conductor 504. In some embodiments, the sensing element 502 may comprise a coil 512 (or loop) of conductive material. The main conductor 504 may connect to the current-carrying conductor 42 at connection points 504a, 504b; e.g., by way of conductive pads formed at connection points 504a, 504b.

In some embodiments, the substrate 532 may be an area of a printed circuit board (PCB) for a larger circuit. In other embodiments, the substrate 532 may be stand-alone, self-contained PCB. The coil 512 may be a trace or a plurality of trace segments formed on the substrate 532. The main conductor 504 may likewise be a trace formed on the substrate 532. The conductive material used to form the traces may be copper or any suitable electrically conductive material. The traces may be formed on the substrate 532 using any of a number of known techniques.

FIG. 5 depicts the coil 512 formed on a first face of the substrate 532. In some embodiments, the coil 512 may be a spiral having one or more turns. The outer end 512b of the coil 512 may terminate at a conductive pad B on the substrate 532. The inner end 512a of the coil 512 may terminate at a conductive pad A on the substrate 532 by way of a return path that comprises vias 514 and 518 formed through the substrate 532, and a trace 516 formed on a second face of the substrate 532 that connects via 514 to via 518. A trace may connect the via 518 to pad A.

In accordance with the present disclosure, the current sensor 402 may further comprise a capacitive shield 522 disposed adjacent to both the sensor element 502 and the main conductor 504. In some embodiments, the capacitive shield 522 may comprise a conductive trace (lead) formed on the substrate 532. One end 522a of the capacitive shield 522 may be "free," or not otherwise connected. Another end 522b of the capacitive shield 522 may connect to a conductive pad C via a trace 524. In some embodiments, the pad C may be connected to ground potential. In other embodiments, the pad B and the pad C may be connected to a common voltage reference.

In operation, when an electric current flows through the current-carrying conductor 42, the current will flow through the main conductor 504. As current flows through the main conductor 504, a magnetic field may arise around the main conductor, for example, when the current is a time-varying current such as an alternating current (AC). The sensor element 502, being in the vicinity of the main conductor 504, may magnetically couple to the magnetic field generated by the main conductor. The area between the sensor element 502 and the main conductor 504 may be referred to as the sensing area. A voltage may be induced in the sensor element 502 that results from magnetically coupling to the magnetic field generated by the main conductor 504. The induced voltage may be amplified by amplifier 48 to generate an output voltage $V_{out}$ representative of the current flowing in the main conductor 504.

The electric field generated by current flowing in the main conductor 504 may capacitively couple to the sensor element 502. The energy that can be coupled to the sensor element 502 can create an error in the generated output voltage $V_{out}$. However, the capacitive shield 522 can capacitively couple the electric field to ground potential, thus preventing the output voltage $V_{out}$ from influence by the electric field.

Figure 6:
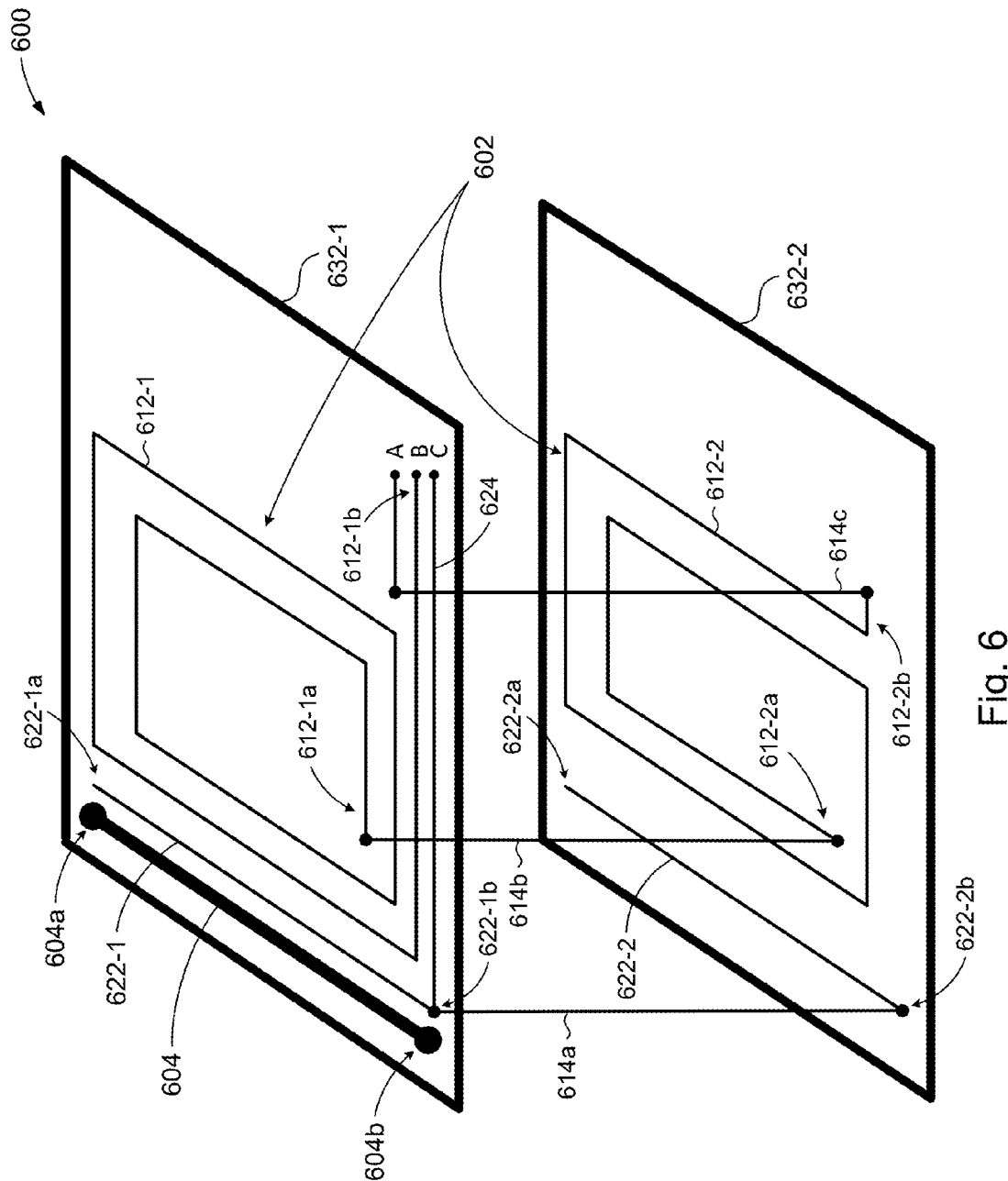
FIG. 6 shows an illustrative embodiment of a current sensor in accordance with aspects of the present disclosure.

FIG. 6 represents an example of a current sensor 600 in accordance with some embodiments of the present disclosure. In some embodiments, the current sensor 600 may comprise a sensing element 602 and a main (target) conductor 604. The sensing element 602 may be disposed adjacent the main conductor 604. In some embodiments, the sensing element 602 may comprise a first coil (or loop) of conductive material 612-1 disposed on a first plane (e.g., as defined by a substrate 632-1) and a second coil of conductive material 612-2 disposed on a second plane (e.g., as defined by a substrate 632-2). The main conductor 604 may be disposed on substrate 632-1. The main conductor 604 may connect to a current-carrying conductor (e.g., 42 in FIG. 4) at connection points 604a, 604b; e.g., by way of conductive pads formed at the connection points.

In some embodiments, the substrates 632-1, 632-2 may be layers in a multilayer PCB. The coils 612-1, 612-2 may be traces formed respective layers of the PCB. The main conductor 604 may likewise be a trace formed on one of the layers; e.g., FIG. 6 shows the main conductor formed on substrate 632-1. The conductive material used to form the traces may be copper or any suitable material. The traces may be formed on the substrates 632-1, 632-2 using any of a number of known techniques.

In some embodiments, the coils 612-1, 612-2 may be connected in series, as shown in FIG. 6 for example. The outer end 612-1b of the coil 612-1 may terminate at a conductive pad B on the substrate 632-1. A via 614b can provide a connection of the inner end 612-1a of coil 612-1 on substrate 632-1 to the inner end 612-2a of coil 612-2 on substrate 632-2. A via 614c can provide a connection of the outer end 612-2b of coil 612-2 on substrate 632-2 to a conductive pad A on substrate 632-1.

In accordance with the present disclosure, the current sensor 600 may further comprise a first capacitive shield 622-1 disposed adjacent to both the coil 612-1 of sensor element 602 and the main conductor 604, and a second capacitive shield 622-2 disposed adjacent to both the coil 612-2 of sensor element 602 and the main conductor 604. The second capacitive shield 622-2 may still be considered to be adjacent the main conductor 604, even though the second capacitive shield and main conductor are in different layers of the multilayer PCB. In some embodiments, the first capacitive shield 622-1 may comprise a conductive trace (lead) formed on substrate 632-1 and likewise the second capacitive shield 622-2 may comprise a conductive trace (lead) formed on substrate 632-2.

In accordance with the present disclosure, the capacitive shields 622-1, 622-2 may be connected together so that each capacitive shield has a free end and a grounded end, so that the capacitive shields do not form a closed loop. FIG. 6 shows a connection configuration in accordance with some embodiments, for example. One end 622-1a of the capacitive shield 622-1 may be "free," or not otherwise connected. Another end 622-1b of the capacitive shield 622-1 may connect to a conductive pad C, for example, via a trace 624. Likewise, one end 622-2a of the capacitive shield 622-2 may be "free," or not otherwise connected. Another end 622-2b of the capacitive shield 622-2 may connect to a conductive pad C; for example, a via 614a may connect end 622-2b to end 622-1a. In some embodiments, the pad C may be connected to ground potential. In other embodiments, the pad B and the pad C may be connected to a common voltage reference.

Figure 6A:
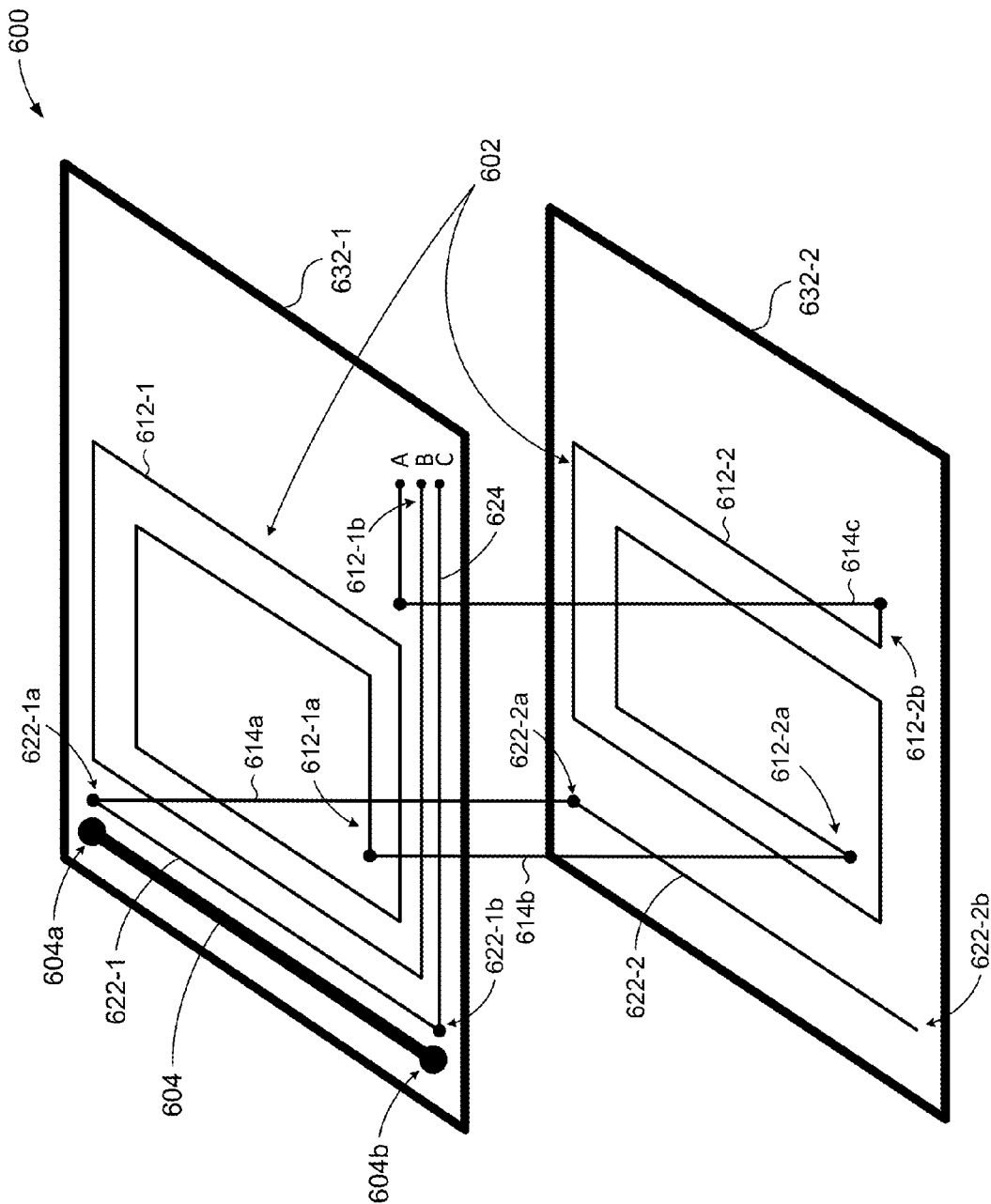
FIG. 6A illustrates an example of an end-to-end connected capacitive shield.

FIG. 6A shows a connection configuration in accordance with other embodiments. In the configuration shown in FIG. 6A, the capacitive shields 622-1, 622-2 may be connected in end-to-end fashion to form a continuous trace. For example, one end 622-2b of capacitive shield 622-2 may be the free end. The other end 622-2a of capacitive shield 622-2 may connect to one end 622-1a of capacitive shield 622-1, for example, using via 614a. The other end 622-1b of capacitive shield 622-1 may connect to pad C, for example, using trace 624. One of ordinary skill will appreciate that still other connection configurations in accordance with the present disclosure may be possible.

One of ordinary skill will appreciate that in some embodiments, the sensor element 602 may comprise additional coils provided on respective additional layers of the multi-layer PCB. In some embodiments, each layer of the multi-layer PCB may be provided with a coil. For example, FIG. 7B described below depicts a two-layer PCB 732' supporting a sensor element 743' comprising a coil in each layer. In other embodiments, the substrate may be an N-layer PCB supporting a sensor element comprising N coils, one coil in each layer. Accompanying each additional coil may be a capacitive shield (trace lead) disposed adjacent to the coil on the same layer (e.g., co-planar with the coil) and also adjacent the main conductor 604.

Figure 7:
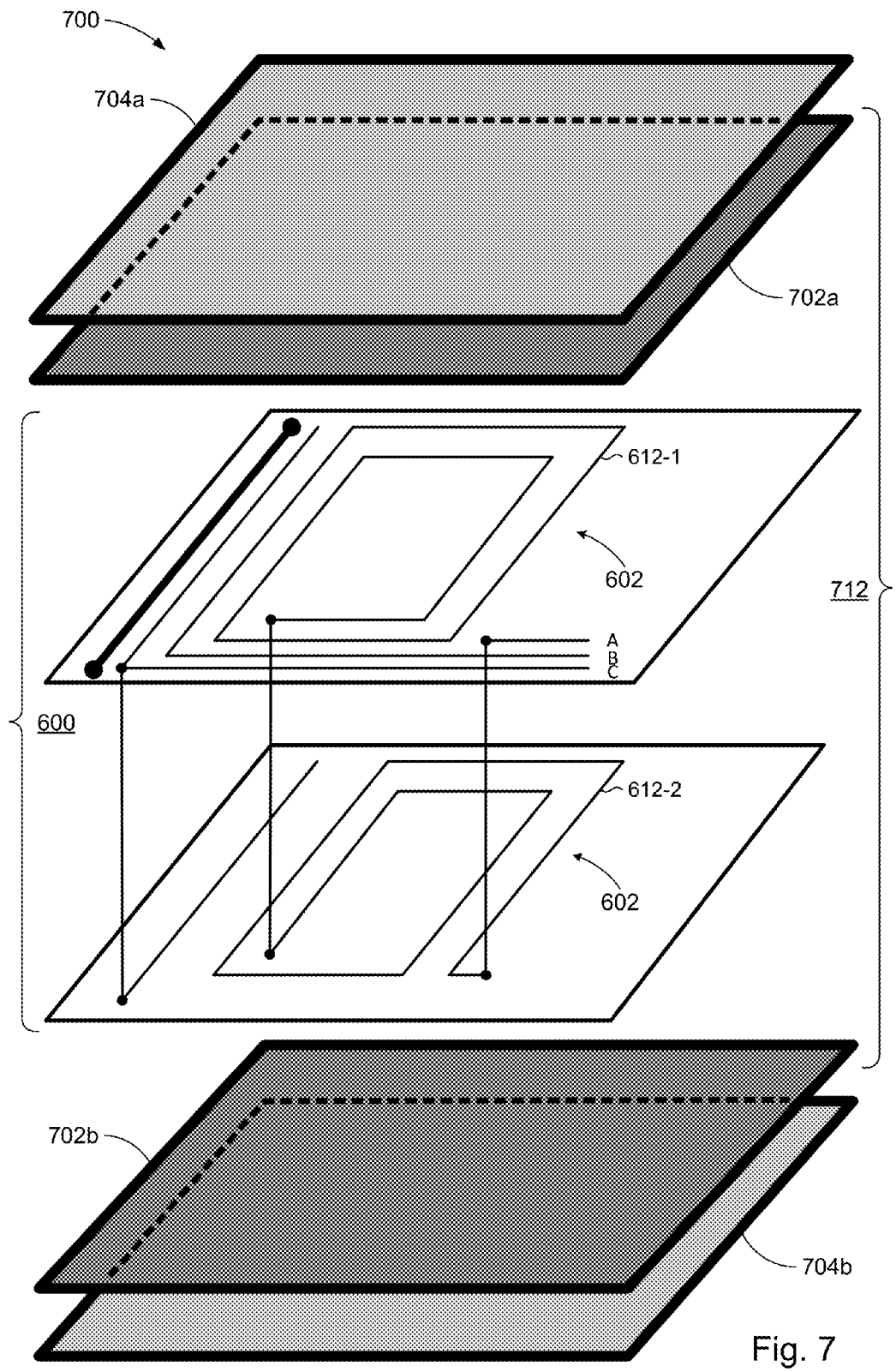
FIG. 7 shows an illustrative embodiment of a magnetic shield in accordance with the present disclosure.

In accordance with the present disclosure, current sensors in accordance with the present disclosure may further include magnetic shielding to shield the current sensor from the effects of external magnetic fields, as further discussed below. Referring to FIG. 7, for example, the current sensor 600 (FIG. 6) may further include a magnetic shield 700. The magnetic shield 700 may comprise layers of a first material 702a, 702b that sandwich the sense element 602, thus defining a stack 712 comprising the layers of first material 702a, 702b and the first and second coils 612-1, 612-2 of the sense element 602. In some embodiments, the layers of first material 702a, 702b may be a ferrite material or other ferromagnetic material.

Further in accordance with the present disclosure, the magnetic shield 700 may comprise layers of a second material 704a, 704b that sandwich the stack 712. In some embodiments, the layers of second material 704a, 704b may be an electrically conductive material. In particular embodiments, the electrically conductive material may be copper tape.

FIGS. 7A and 7B show schematic side views of magnetic shield 700 in accordance with some embodiments. FIG. 7A shows a portion of a substrate 732 having formed thereon the various traces 734 for components (e.g., coil 612-1, capacitive shield 622-1, etc. in FIG. 6) that comprise a current sensor (e.g., 600, FIG. 6) according to the present disclosure. The magnetic shield 700 comprises first material 702 that sandwiches the substrate 732 and traces 734 to form stack 712. In some embodiments, the first material 702 may be a ferrite material. The magnetic shield 700 further comprises second material 704 that sandwiches the stack 712. In some embodiments, the second material 704 may be an electrically conductive material, such as copper tape for example.

FIG. 7B illustrates magnetic shield 700 in accordance with other embodiments. Instead of a single-layer substrate (e.g., 732), the substrate 732' represents an example of a multilayer PCB, in this case a two-layer PCB. Traces 734' represent traces formed in the layers of the substrate 732' for components comprising a current sensor (e.g., coil and capacitive shield) according to some embodiments of the present disclosure.

The effect of magnetic shield 700 will now be discussed. Consider first, a configuration of a current sensor without a magnetic shield, such as current sensor 402 illustrated in FIG. 5 for example. Suppose the current sensor 402 is configured to sense current in a conductor configured to drive a transmit coil in a wireless power transfer system. During operation, the transmit coil may be drive to generate an external magnetic field for coupling power to a receiver. This external magnetic field can couple to the sense element 502. The voltage, which can be induced in the sense element 502 as a result of coupling to the external magnetic field, can introduce an error in the output signal $V_{out}$. The error can be pronounced if the external magnetic field varies (e.g., due to varying load conditions at the receiver side) when the current flowing in main conductor 504 is constant; in other words, variations in the external magnetic field can produce variations in the output signal $V_{out}$ even though the current flow in main conductor 504 is constant. Since the current sensor 402 is used to provide feedback to adjust the generated field or to detect foreign objects in the generated field, it may be beneficial to ensure that the generated field does not interfere with the sensed current.

Figure 8:
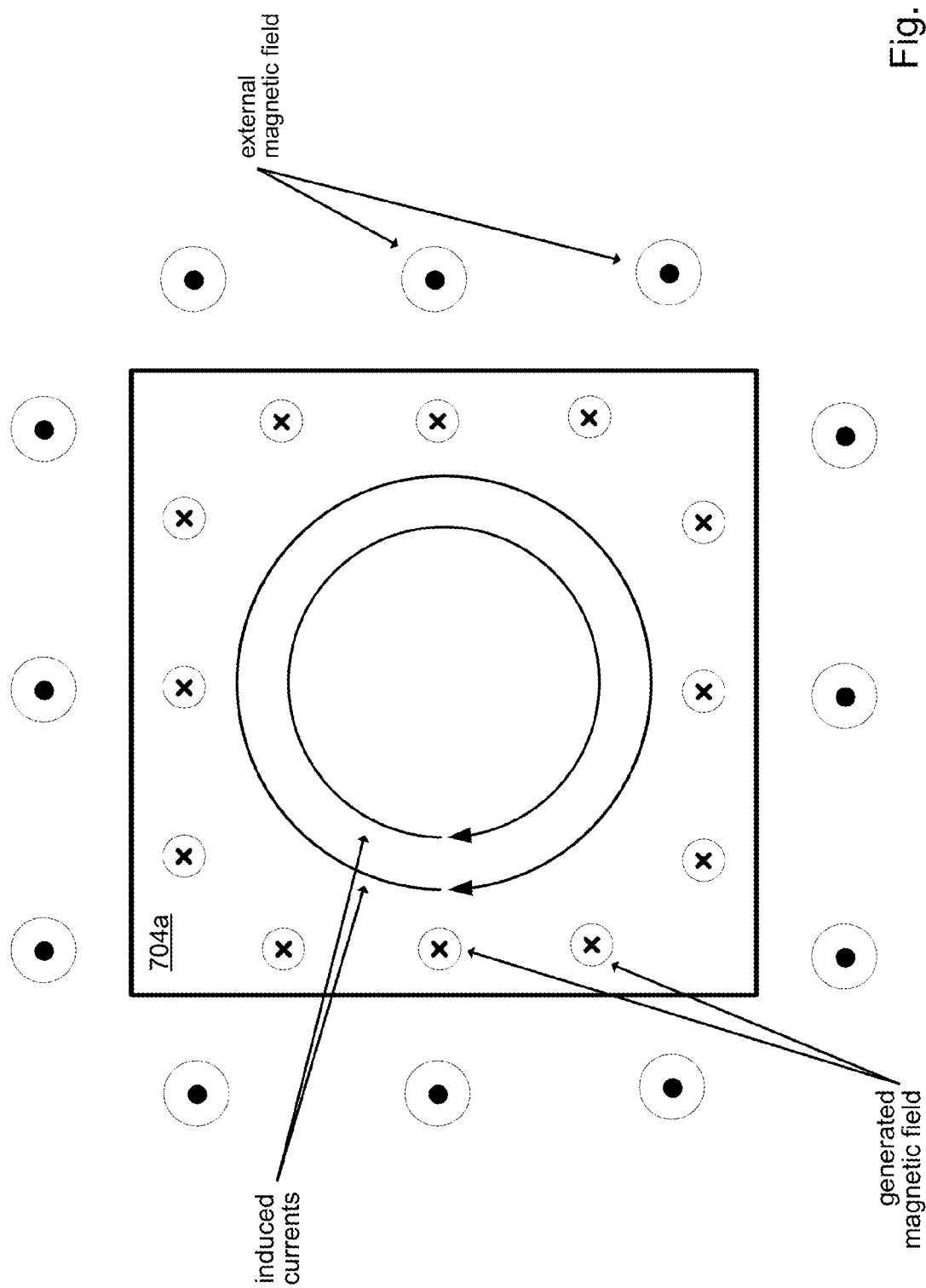
FIG. 8 demonstrates an aspect of the magnetic shield of FIG. 7.

Consider next, the magnetic shield 700 shown in FIG. 7 with reference to FIG. 8. The effect of magnetic shield 700 can be explained in connection with the schematic representation depicted in FIG. 8. The illustration is a view looking down on the electrically conductive layer of second material 704a of the magnetic shield 700. An external magnetic field can couple to the electrically conductive layer of second material 704a. Eddy currents can be induced in the electrically conductive layer of second material 704a under the influence of the external magnetic field. The eddy currents induced in the electrically conductive layer of second material 704a, in turn, can generate a magnetic field that opposes the external magnetic field and thus can have a cancelling effect on the external magnetic field. A similar effect occurs with the electrically conductive layer of second material 704b. The electrically conductive layers of second material 704a, 704b can therefore shield the sensing element (e.g., 602) so that the output voltage $V_{out}$ can be substantially free of influence from the external magnetic field.

The electrically conductive layers of second material 704a, 704b may also act on the magnetic field generated by current flowing in the main conductor (e.g., 604, FIG. 6). The electrically conductive layers of second material 704a, 704b can generate a magnetic field that opposes the magnetic field generated by current flowing in the main conductor, which can be an undesirable effect. Therefore, in accordance with the present disclosure, the layers of first material 702a, 702b may be a ferrite material. The ferrite layers 702a, 702b can serve to close the path for the magnetic field generated by current flowing in the main conductor (e.g., 604, FIG. 6) so that the magnetic shield 700, in particular the layers of second material 704a, 704b, does not respond with an opposing magnetic field, while at the same time shielding the external magnetic field as described above. Accordingly, the output voltage $V_{out}$ can be substantially free of influence from the act of shielding the sensing area from an external magnetic field.

Figure 9:
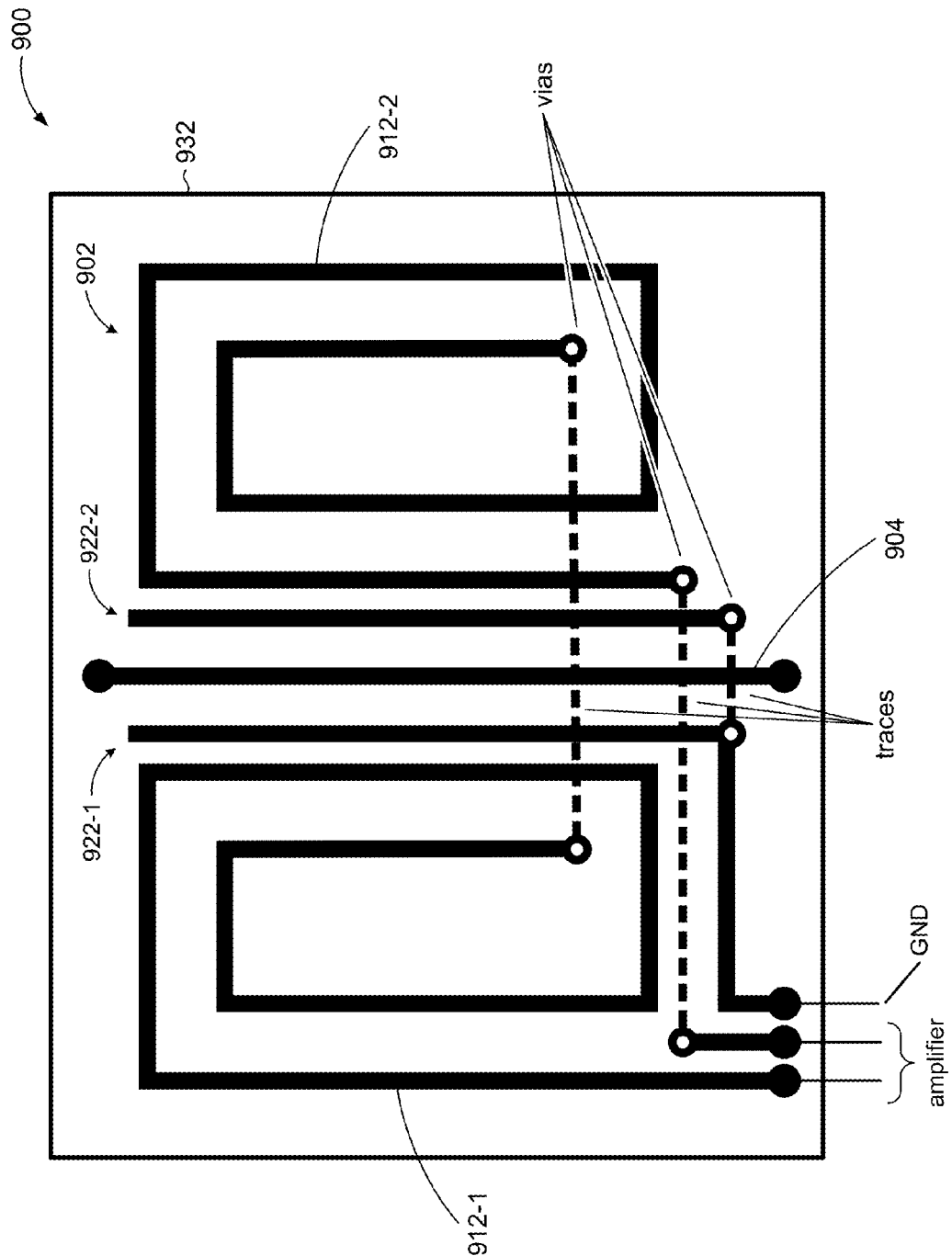
FIG. 9 shows an illustrative embodiment of a current sensor in accordance with aspects of the present disclosure.

FIG. 9 shows a current sensor 900 in accordance with some embodiments of the present disclosure. In some embodiments, the current sensor 900 may comprise a sensing element 902 and a main conductor 904 disposed on a plane, for example, as defined by substrate 932. The sensing element 902 may comprise a first coil of conductive material 912-1 and a second coil of conductive material 912-2. In some embodiments, the first and second coils 912-1, 912-2 may be substantially co-planar on the substrate 932 and in opposed relation to each other. The first and second coils 912-1, 912-2 may be connected in series. For example, vias may be used to route traces on an opposite face of the substrate 932 in order to connect the first and second coils 912-1, 912-2 in series.

In accordance with the present disclosure, the current sensor 900 may further comprise a first capacitive shield 922-1 disposed adjacent to both the first coil 912-1 and the main conductor 904, and a second capacitive shield 922-2 disposed adjacent to both the second coil 912-2 and the main conductor 904. In some embodiments, the first and second capacitive shields 922-1, 922-2 may comprise conductive traces (leads) formed on the substrate 932. One end of respective first and second capacitive shields 922-1, 922-2 may be "free," or not otherwise connected. Another end of respective first and second capacitive shields 922-1, 922-2 may be connected to a common point (e.g., GND). Though not shown in FIG. 9, the current sensor 900 may further include a magnetic shield such as illustrated in FIG. 7A, for example.

FIG. 9A shows a current sensor 900' in accordance with some embodiments of the present disclosure. The current sensor 900' can be used to sense current flowing in two main conductors 904a, 904b. For example, the current sensor 900' may be used to sense current flow in the conductive leads of a differential amplifier; see, for example, the configuration illustrated in FIG. 4B. The sense element 902 may comprise first, second, and third coils 912-1, 912-2, 912-3 configured to be adjacent the main conductors 904a, 904b. The current sensor 900' may include capacitive shields 922-1, 922-2 configured to shield the coils 912-1, 912-2 from an electric field that can emanate from main conductor 904a. The current sensor 900' may further include capacitive shields 922-3, 922-4 configured to shield the coils 912-2, 912-3 from an electric field that can emanated from main conductor 904b. Though not shown in FIG. 9A, the current sensor 900' may further include a magnetic shield such as illustrated in FIG. 7A, for example.

Figure 10A:
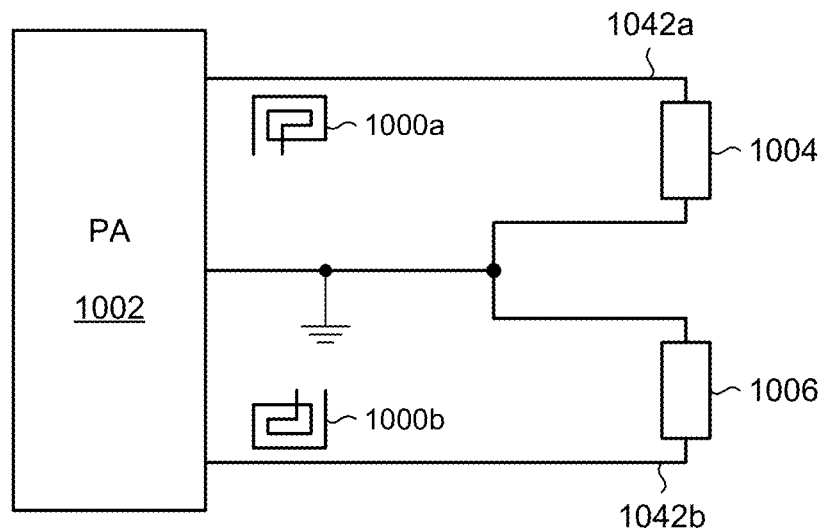
FIGS. 10A, 10B, 10C, and 10D show illustrative configurations of current sensors in accordance with the present disclosure.
Figure 10B:
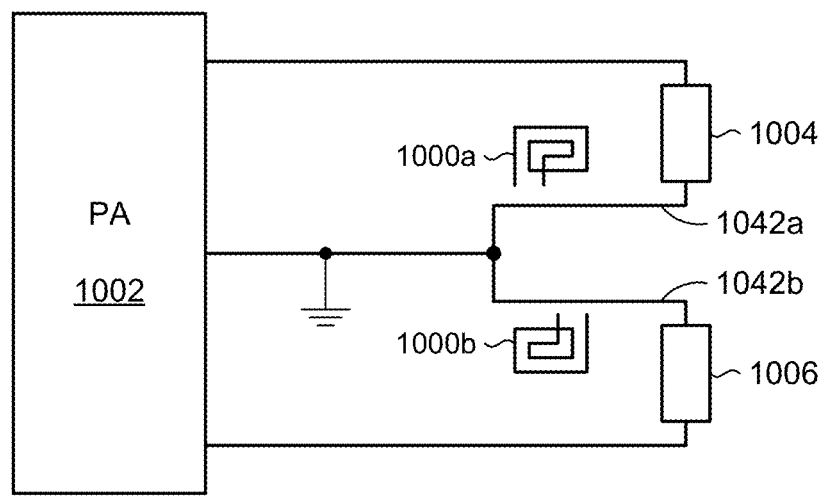

In accordance with the present disclosure, the single-conductor current sensors (e.g., 402 in FIG. 5) may be used with a differential power amplifier. Differential power amplifiers, for example, may be integrated in wireless power transmit circuitry to drive a transmit coil. FIGS. 10A and 10B schematically depict illustrative embodiments of differential power amplifier configurations. FIG. 10A for example, shows a differential power amplifier 1002 connected to loads 1004, 1006. Current sensors 1000a, 1000b may be disposed along conductors 1042a, 1042b to sense a flow of current in the respective conductors. The current sensors 1000a, 1000b may be connected together in series to produce a single output (e.g., 408, FIG. 4B) that can be connected to an amplifier (e.g., 48, FIG. 4B). Referring to FIG. 5, for example, pad B of current sensor 1000a may be connected to pad A of current sensor 1000b. Pad A of current sensor 1000a and pad B of current sensor 1000b may be the inputs to an amplifier (e.g., 48).

FIG. 10B illustrates a configuration in which the conductors 1042a, 1042b that are sensed by current sensors 1000a, 1000b may be disposed along the ground paths from respective loads 1004, 1006. The current sensors 1000a, 1000b may be connected in series. The configuration shown in FIG. 10B may be advantageous in some applications, since the line voltage in conductors 1042a, 1042b is close to ground potential.

Figure 10C:
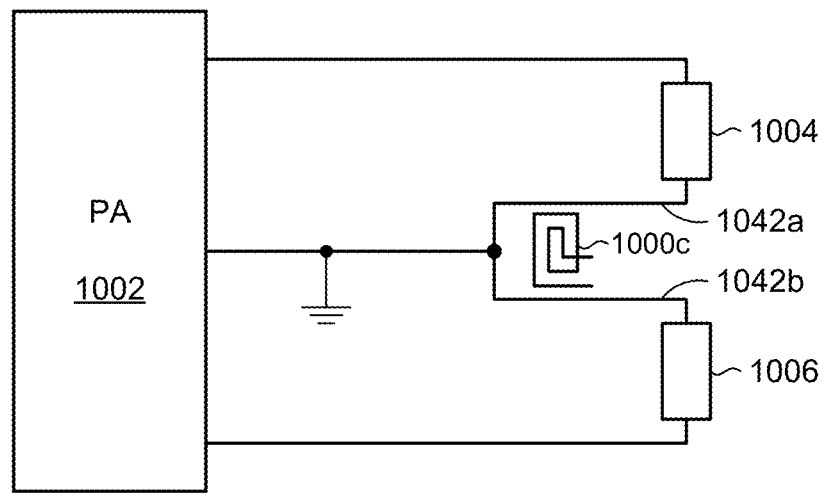

FIG. 10C illustrates a configuration of a dual-conductor single current sensor 1000c, such as illustrated in FIG. 9A for example, for sensing the current flow in conductors 1042a, 1042b of the differential amplifier 1002. The configuration shown in FIG. 10C shows the conductors 1042a, 1042b to be along the ground path. In other embodiments, however, the conductors 1042a, 1042b that are sensed by the current sensor 1000c may be at the outputs of the differential power amplifier 1002.

Figure 10D:
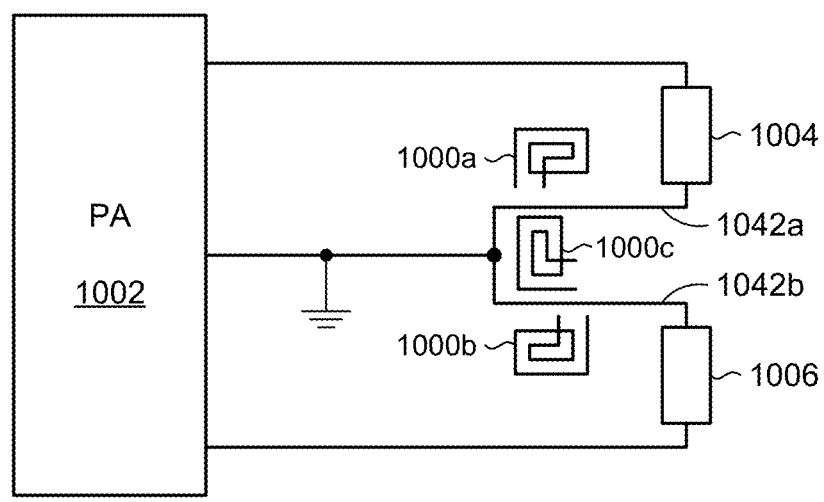

In still other embodiments, three or more current sensors may be used. For example, the configuration two single-conductor current sensors 1000a, 1000b shown in FIG. 10B may be combined in series fashion with the dual-conductor current sensor 1000c shown in FIG. 10C. FIG. 10D illustrates an example of such a configuration.

In accordance with the present disclosure, a current sensor may include first means for magnetically coupling, at a sensing area proximate a conductor, to a first magnetic field generated by a current flow in the conductor, the first means having an output representative of the current flow. The sensor element 502 shown in FIG. 5 represents an illustrative example of the first means in accordance with some embodiments. The sensor element 602 in shown in FIG. 6 represents an illustrative example of the first means in accordance with some embodiments.

In accordance with the present disclosure, a current sensor may further include second means for generating a second magnetic field that opposes the external magnetic field to shield the sensing area from the external magnetic field so that the output of the first means is substantially free of influence from the external magnetic field. The magnetic shield 700 shown in FIGS. 7, 7A, and 7B represent illustrative examples of the second means in accordance with some embodiments. Moreover, the layers of electrically conductive second material 704a, 704b represent an illustrative example of the second means in accordance with some embodiments.

In accordance with the present disclosure, a current sensor may further include third means for shielding the sensing area from the second means so that the output of the first means is substantially free of influence from effects of the second means. The magnetic shield 700 shown in FIGS. 7, 7A, and 7B represent illustrative examples of the third means in accordance with some embodiments. Moreover, the layers of first material 702a, 702b represent an illustrative example of the third means in accordance with some embodiments.

In accordance with the present disclosure, a current sensor may further include fourth means for shielding an electric field generated by the current flow in the conductor so that the output of the first means is substantially free of influence from the electric field. The capacitive shield 522 shown in FIG. 5 represents an illustrative example of the fourth means in accordance with some embodiments. The capacitive shield 622 shown in FIG. 6 represents an illustrative example of the fourth means in accordance with some embodiments.

Current sensors may be used in wireless power circuitry; e.g., to provide feedback for power control. Current sensors may be particularly useful for lost power determination. For example, current sensors may used detect an amount of power transmitted in order to determine the amount of power lost based on what the receiver is receiving, or to detect the presence of objects consuming power on the pad.

Current sensors in accordance with the present disclosure are easy to implement. The sensor element (e.g., 502, FIG. 5) may be designed along with the other traces on the PCB. In some embodiments, they may only require a small about of PCB area and a correspondingly small amount of ferrite and copper tape. For example, in some embodiments, a current sensor in accordance with the present disclosure may only consume less than 1 cm$^2$ of PCB area, although the size is not relevant and may be larger or smaller in other embodiments. Current sensors in accordance with the present disclosure adapt nicely to mass production processes.

Current sensors in accordance with the present disclosure do not interact directly with the current flow that is being sensed. Therefore, the current sensor creates no imbalance in the power amplifier that supplies the current. In addition, current sensors in accordance with the present disclosure can provide an output voltage that is isolated from the output of the power amplifier.

Current sensors in accordance with the present disclosure do not emit EMI because there is no switching circuitry.

Current sensors in accordance with the present disclosure create a voltage waveform that is 90 degrees out of phase with current and thus can provide a usable phase angle measurement of the current flow. In addition, the zero crossing of this waveform can be compared to that of the power amplifier output voltage to provide an accurate measure of phase angle. This phase angle can be used for both load power and impedance measurements.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed:

1. A current sensor operative to sense a flow of current in a conductor, the current sensor comprising:
   a sense element configured to couple to a first magnetic field generated by the flow of current in the conductor and to produce a signal that is representative of the flow of current in the conductor;
   a capacitive shield disposed adjacent the sense element, the capacitive shield effective to prevent an electric field generated by the flow of current in the conductor from being capacitively coupled to the sense element, wherein the capacitive shield comprises a conductive lead configured to be disposed adjacent to both the sense element and the conductor, wherein the conductive lead comprises a free first end and a second end configured for a connection to ground potential; and
   a shield comprising a first material that sandwiches the sense element to define a stack, and a second material that sandwiches the stack,
   the shield configured to generate a second magnetic field, responsive to a third magnetic field external to the current sensor, that opposes the third magnetic field,
   the shield further configured to prevent production of a shield generated magnetic field, resulting from the flow of current in the conductor, that opposes the first magnetic field generated by the flow of current in the conductor.

2. The current sensor of claim 1, wherein the shield is further configured to close a path for the first magnetic field.

3. The current sensor of claim 1, wherein the first material in the shield is a ferrite material and the second material in the shield is an electrically conductive material.

4. The current sensor of claim 1, wherein the sense element comprises an electrically conductive coil disposed on a substrate and adjacent the conductor.

5. The current sensor of claim 4, wherein the substrate is a layer of a multi-layer PCB.

6. The current sensor of claim 1, wherein the sense element comprises a first electrically conductive coil disposed on a first plane and at least a second electrically conductive coil disposed on at least a second plane spaced apart from the first plane.

7. The current sensor of claim 6, wherein the first capacitive shield configured to be disposed adjacent to both the first electrically conductive coil and the conductor, and at least a second capacitive shield configured to be disposed adjacent to both the second electrically conductive coil and the conductor.

8. The current sensor of claim 6, wherein the first electrically conductive coil is connected in series with the second electrically conductive coil.

9. The current sensor of claim 6, wherein the first electrically conductive coil is a trace formed on a first layer of a multi-layer printed circuit board (PCB) and the second electrically conductive coil is a trace formed on a second layer of the multi-layer PCB.

10. The current sensor of claim 1, wherein the sense element comprises a first electrically conductive coil arranged to be adjacent the conductor; and
a second electrically conductive coil disposed in opposed relation to the first electrically conductive coil and arranged to be adjacent the conductor.

11. The current sensor of claim 10, wherein the first electrically conductive coil and the second electrically conductive coil are substantially coplanar.

12. The current sensor of claim 10, wherein the first electrically conductive coil is on a plane separate from the second electrically conductive coil.

13. The current sensor of claim 1, further comprising an amplifier circuit connected to the sense element and configured to generate an output voltage based on the signal produced by the sense element.

14. The current sensor of claim 1, wherein the conductor constitutes a portion of or is configured to drive a transmit coil configured to generate an external magnetic field for wireless power transfer, wherein the external magnetic field constitutes the third magnetic field.

15. A method of sensing a flow of current in a conductor comprising:
generating an output voltage representative of the current flowing in the conductor by magnetically coupling, at a sensing area, to a first magnetic field generated by the current flowing in the conductor, wherein magnetically coupling to the first magnetic field includes presenting the first magnetic field to a coil of electrically conductive material disposed adjacent the conductor;
shielding the sensing area from an external magnetic field including generating a second magnetic field that opposes the external magnetic field so that the output voltage generated by magnetically coupling to the first magnetic field is substantially free of influence from the external magnetic field;
shielding the sensing area from an electric field generated by the current flowing in the conductor by coupling the electric field to a conductive lead that is disposed adjacent to both the conductor and the coil of electrically conductive material and connected to ground potential; and
preventing production of a shield-generated magnetic field, resulting from the flow of current in the conductor, that opposes the first magnetic field generated by the flow of current in the conductor.

16. The method of claim 15, wherein preventing production of the magnetic field that opposes the first magnetic field includes coupling the first magnetic field to a ferrite material that at least partially encloses the sensing area.

17. The method of claim 16, wherein shielding the sensing area from the external magnetic field includes coupling the external magnetic field to an electrically conductive material that at least partially encloses the ferrite material.

18. The method of claim 15, further comprising shielding the sensing area from an electric field generated by the current flowing in the conductor so that the generated output voltage is substantially free of influence from the electric field.

19. The method of claim 15, wherein magnetically coupling to the first magnetic field includes coupling the first magnetic field to a first coil of electrically conductive material disposed adjacent the conductor and a second coil of electrically conductive material disposed adjacent the conductor.

20. A current sensor comprising:
first means for magnetically coupling, at a sensing area proximate to a conductor, to a first magnetic field generated by a current flow in the conductor, the first means having an output representative of the current flow;
second means for generating a second magnetic field that opposes an external magnetic field to shield the sensing area from the external magnetic field so that the output of the first means is substantially free of influence from the external magnetic field;
third means for shielding the sensing area from the second means to prevent production of a shield generated magnetic field, resulting from the flow of current in the conductor, that opposes the first magnetic field generated by the flow of current in the conductor so that the output of the first means is substantially free of influence from effects of the second means; and
a fourth means for capacitively shielding the sensing area to prevent an electric field generated by the flow of current in the conductor from being capacitively coupled to the sense element, wherein the fourth means includes a conductive lead configured to be disposed adjacent to both the sensing area and the conductor, the conductive lead including a free first end and a second end configured for a connection to a ground potential.

* * * * *